US008008618B2

(12) United States Patent
Londry

(10) Patent No.: US 8,008,618 B2
(45) Date of Patent: Aug. 30, 2011

(54) MULTIPOLE ION GUIDE FOR PROVIDING AN AXIAL ELECTRIC FIELD WHOSE STRENGTH INCREASES WITH RADIAL POSITION, AND A METHOD OF OPERATING A MULTIPOLE ION GUIDE HAVING SUCH AN AXIAL ELECTRIC FIELD

(76) Inventor: Frank Londry, Omemee (CA)

( * ) Notice: Subject to any disclaimer, the term of this patent is extended or adjusted under 35 U.S.C. 154(b) by 256 days.

(21) Appl. No.: 12/480,829

(22) Filed: Jun. 9, 2009

(65) Prior Publication Data

US 2009/0302216 A1 Dec. 10, 2009

Related U.S. Application Data

(60) Provisional application No. 61/059,962, filed on Jun. 9, 2008.

(51) Int. Cl.
*H01J 37/05* (2006.01)
*H01J 49/26* (2006.01)

(52) U.S. Cl. ......... 250/283; 250/281; 250/282; 250/290

(58) Field of Classification Search .................. 250/281, 250/282, 283, 284, 290, 292, 293
See application file for complete search history.

(56) References Cited

U.S. PATENT DOCUMENTS 2,939,952 A 12/1954 Paul et al.
4,755,670 A 7/1988 Syka et al.
5,179,278 A 1/1993 Douglas
5,420,425 A 5/1995 Bier et al.

(Continued)

FOREIGN PATENT DOCUMENTS

GB 2449760 12/2008

(Continued)

OTHER PUBLICATIONS

International Search Report of PCT application PCT/CA2009/000805, mailed on Sep. 8, 2009.

(Continued)

*Primary Examiner* — Robert Kim
*Assistant Examiner* — Nicole Ippolito Rausch

(57) ABSTRACT

A mass spectrometer having an elongated rod set, the rod set having a first end, a second end, a plurality of rods and a central longitudinal axis is described as is a method operating same. Embodiments involve a) admitting ions into the rod set; b) producing an RF field between the plurality of rods to radially confine the ions in the rod set, wherein the RF field varies along at least a portion of a length of the rod set to provide, for each of the ions, a corresponding first axial force acting on the ion to push the ion in a first axial direction; and, c) for each of the ions, providing a corresponding second axial force to push the ion in a second axial direction opposite to the first axial direction; wherein the corresponding first axial force increases relative to the corresponding second axial force with radial displacement of the ion from the central longitudinal axis in any direction orthogonal to the central longitudinal axis such that the first corresponding axial force is less than the corresponding second axial force when the ion is less than a threshold radial distance from the central longitudinal axis and the corresponding first axial force exceeds the corresponding second axial force when the ion is radially displaced from the central longitudinal axis by more than the threshold radial distance in any direction orthogonal to the central longitudinal axis.

30 Claims, 8 Drawing Sheets

U.S. PATENT DOCUMENTS

| | | | | |
|---|---|---|---|---|
| 5,783,824 | A | 7/1998 | Baba et al. | |
| 6,177,668 | B1 | 1/2001 | Hager | |
| 6,417,511 | B1 | 7/2002 | Russ et al. | |
| 6,483,109 | B1 | 11/2002 | Reinhold et al. | |
| 6,627,876 | B2 | 9/2003 | Hager | |
| 6,627,883 | B2 | 9/2003 | Wang et al. | |
| 6,770,871 | B1 | 8/2004 | Wang et al. | |
| 6,897,438 | B2 | 5/2005 | Soudakov et al. | |
| 7,072,038 | B2 | 7/2006 | Quist et al. | |
| 7,084,398 | B2 | 8/2006 | Loboda et al. | |
| 7,119,331 | B2 | 10/2006 | Chang et al. | |
| 7,217,919 | B2 | 5/2007 | Boyle et al. | |
| 7,227,137 | B2 | 6/2007 | Londry et al. | |
| 7,285,774 | B2 | 10/2007 | Guevremont | |
| 7,709,785 | B2 * | 5/2010 | Jolliffe et al. | 250/282 |
| 2004/0135080 | A1 | 7/2004 | Ouyang et al. | |
| 2005/0269504 | A1 | 12/2005 | Hashimoto et al. | |
| 2007/0045533 | A1 | 3/2007 | Krutchinsky et al. | |
| 2008/0073497 | A1 | 3/2008 | Kovtoun | |
| 2008/0142705 | A1 | 6/2008 | Schwartz et al. | |
| 2008/0210860 | A1 | 9/2008 | Kovtoun | |
| 2008/0265155 | A1 * | 10/2008 | Kovtoun | 250/292 |
| 2009/0140141 | A1 * | 6/2009 | Hansen | 250/292 |

FOREIGN PATENT DOCUMENTS

| | | |
|---|---|---|
| WO | WO2006/075182 | 7/2006 |
| WO | WO2007/072038 | 6/2007 |
| WO | WO2009/030900 | 3/2009 |
| WO | WO2009/150410 | 12/2009 |

OTHER PUBLICATIONS

A. Krutchinski, H. Cohen and B.T. Chait, "A Novel High Capacity Ion Trap-Quadrupole Tandem Mass Spectrometer", Int. J. Mass Spectrometer (2007), in press, doi: 10.1106/j.ijms.2007.06.15.

Paul Lorrain and Dale Corson, "Electromagnetic Fields and Waves, Second Edition", W.H. Freeman and Company, San Francisco, 1970, ISBN 0-7167-0331-9, p. 347.

Londry F. A. and Hager, J. W., "Mass-Selective Axial Ejection from a Linear Quadrupole Ion Trap", J Am Soc Mass Spectrom 2003, 14, 1130-1147, Eq. 20.

Co-pending U.S. Appl. No. 12/480,160, "Method of Operating Tandem Ion Traps", filed Jun. 8, 2009.

International Search Report and Written Opinion, PCT/CA2009/000812, mailed on Sep. 1, 2009.

* cited by examiner

MULTIPOLE ION GUIDE FOR PROVIDING AN AXIAL ELECTRIC FIELD WHOSE STRENGTH INCREASES WITH RADIAL POSITION, AND A METHOD OF OPERATING A MULTIPOLE ION GUIDE HAVING SUCH AN AXIAL ELECTRIC FIELD

This is a non-provisional application of U.S. Application No. 61/059,962 filed Jun. 9, 2008. The contents of U.S. Application No. 61/059,962 are incorporated herein by reference.

FIELD OF THE INVENTION

The present invention relates generally to mass spectrometry, and more particularly relates to a method and apparatus for mass selective axial transport using an axial electric field whose strength increases with radial position.

INTRODUCTION

Many types of mass spectrometers are known, and are widely used for trace analysis to determine the structure of ions. These spectrometers typically separate ions based on the mass-to-charge ratio ("m/z") of the ions. One such mass spectrometer system involves mass-selective axial ejection—see, for example, U.S. Pat. No. 6,177,668 (Hager), issued Jan. 23, 2001. This patent describes a linear ion trap including an elongated rod set in which ions of a selected mass-to-charge ratio are trapped. These trapped ions may be ejected axially in a mass selective way as described by Londry and Hager in "Mass Selective Axial Ejection from a Linear Quadrupole Ion Trap," J Am Soc Mass Spectrom 2003, 14, 1130-1147. In mass selective axial ejection, as well as in other types of mass spectrometry systems, it will sometimes be advantageous to control the axial location of different ions.

SUMMARY OF THE INVENTION

In accordance with an aspect of an embodiment of the present invention, there is provided a method of operating a mass spectrometer having an elongated rod set, the rod set having a first end, a second end, a plurality of rods and a central longitudinal axis. The method comprises a) admitting ions into the rod set; b) producing an RF field between the plurality of rods to radially confine the ions in the rod set, wherein the RF field varies along at least a portion of a length of the rod set to provide, for each of the ions, a corresponding first axial force acting on the ion to push the ion in a first axial direction; and, c) for each of the ions, providing a corresponding second axial force to push the ion in a second axial direction opposite to the first axial direction; wherein the corresponding first axial force increases relative to the corresponding second axial force with radial displacement of the ion from the central longitudinal axis in any direction orthogonal to the central longitudinal axis such that the first corresponding axial force is less than the corresponding second axial force when the ion is less than a threshold radial distance from the central longitudinal axis and the corresponding first axial force exceeds the corresponding second axial force when the ion is radially displaced from the central longitudinal axis by more than the threshold radial distance in any direction orthogonal to the central longitudinal axis.

In accordance with an aspect of a second embodiment of the present invention, there is provided a mass spectrometer system comprising: a) an ion source; b) a rod set, the rod set having a plurality of rods extending along a longitudinal axis, a first end for admitting ions from the ion source, and a second end for ejecting ions traversing the longitudinal axis of the rod set; c) an RF voltage supply module for i) providing an RF voltage to the rod set to produce an RF field between the plurality of rods of the rod set to radially confine the ions in the rod set, wherein the rod set is configured such that the RF field varies along at least a portion of the rod set to provide, for each of the ions, a corresponding first axial force acting on the ion to push the ion in a first axial direction; and, d) a secondary voltage supply module for i) providing a secondary voltage to the rod set to provide, for each of the ions, a corresponding second axial force to push the ion in a second axial direction opposite to the first axial direction; wherein the corresponding first axial force increases relative to the corresponding second axial force with radial displacement of the ion from the central longitudinal axis in any direction orthogonal to the central longitudinal axis such that the first corresponding axial force is less than the corresponding second axial force when the ion is less than a threshold radial distance from the central longitudinal axis and the corresponding first axial force exceeds the corresponding second axial force when the ion is radially displaced from the central longitudinal axis by more than the threshold radial distance in any direction orthogonal to the central longitudinal axis.

BRIEF DESCRIPTION OF THE DRAWINGS

The skilled person in the art will understand that the drawings, described below are for illustration purposes only. The drawings are not intended to limit the scope of the applicant's teachings in any way.

DETAILED DESCRIPTION OF THE INVENTION

Figure 1:
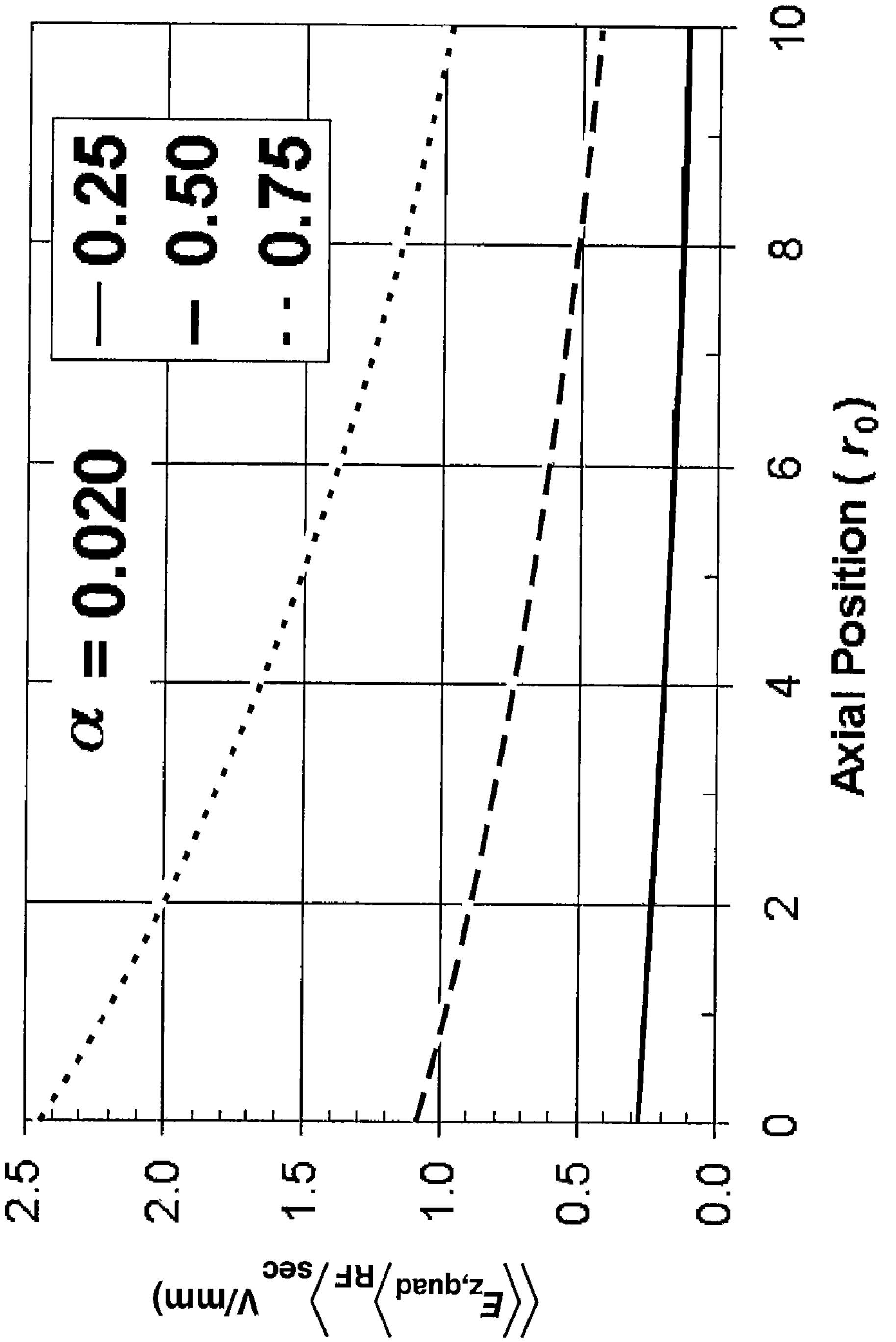
FIG. 1, in a graph, plots axial field strength in units of V/mm as a function of axial position for various radial amplitudes in a quadrupole rod set providing a positive axial electric field in accordance with an aspect of an embodiment of the invention.

As will be described below in more detail, an axial field can be provided in a multipole rod set by varying axially the strength of the radial RF field, in other words by introducing an axial dependence into the radial RF field. The strength of the radial RF field can be varied as a function of axial position in a number of ways. One method is to use segmented rods, with adjacent segments coupled capacitively. Another is to use inductive rods. A third method is to use divergent rods. This third method is described immediately below for descriptive purposes. For example, in a linear ion trap in which the radius of the circle inscribed between the rods diverges by only one or two percent toward the exit end, an axial field that increases quadratically with radial position can be provided. If a counterbalancing negative axial field can be superposed with this positive axial electric field then ion sorting may be possible. If the counterbalancing negative axial field has an effective strength that increases less rapidly with radial position than the positive axial electric field, then this counterbalancing negative axial field can be superposed with the positive axial electric field to push ions with relatively high radial amplitudes towards the exit end, while thermalized ions accumulate at the entrance end.

For the moment assume that thermalized ions are concentrated at the entrance end, and when they are excited radially they will experience a net positive axial force toward the exit end, which positive axial force increases quadratically with increasing radial position. As an ion moves toward the exit end, its effective q-value (Mathieu stability parameter) decreases with increasing axial position. However, at any particular axial position, an ion's q-value would increase as the RF amplitude is ramped positively with time. Therefore, as the ion moved toward the exit, its secular frequency would decrease, but in response to increasing RF amplitude its secular frequency would increase. Presumably, it should be possible to identify operational parameters that result in highly efficient axial ejection with acceptable mass resolution. These operational parameters could include the length of the cell or multipole, the angle of divergence of the rods, the special characteristics of the counterbalancing force, the scan rate of the RF amplitude, and amplitude of the auxiliary RF field used for radial resonant excitation.

In order to achieve mass-selective axial positioning, the above-described positive axial force can be counterbalanced by a negative axial force such that thermalized ions can be concentrated within a specific axial range toward the entrance end of a linear ion trap (LIT). Several possibilities exist for the counterbalancing axial force. One possibility could be weak quadrupolar DC applied to quadrupole rods. Another possibility could be longitudinally tapered T-electrodes, positioned radially on the asymptotes of the multipole trapping field. A third possibility is a simple rod-offset axial barrier, which could be created by applying different DC offset potentials to adjacent rod segments. A fourth possibility would be to replace the longitudinally tapered T-electrodes with segmented auxiliary rods as described, for example, in U.S. Pat. No. 5,847,386 (see column 13 and FIG. 32). A fifth possibility would be to apply different DC offset potentials to either end of resistively-coupled rod segments.

One method of providing the counterbalancing axial force toward the entrance end would be with quadrupolar DC of the correct polarity as described, for example, in United States Patent publication No. 2006/0289744. One possible disadvantage of this method is that the axial force generated by the quadrupolar DC also increases quadratically with radial position and it would be simpler if the counterbalancing force increased less strongly with radial position than the axial force toward the exit. A second disadvantage would be a scan line that did not lie on the q-axis, with a concomitant loss of the highest mass ions.

Another factor to consider is that the direction of the axial force generated by quadrupolar DC depends upon the relative amplitude of an ion's radial motion between the two poles. This characteristic can work to advantage because thermal ions can tend to have higher radial amplitude between the rods of the attractive pole, and if the rods diverged, those ions would feel a net force toward the entrance end. In addition, if the ions were excited between the rods of the repulsive pole, they could be accelerated toward the exit. In fact, quadrupolar DC could be applied uniformly to divergent rods, rather than dropping quadrupolar DC resistively over a length of parallel rods as described in United States Patent publication No. 2006/0289744. However, this could be difficult to implement because of the relative strengths of the forces generated by the DC and RF components of the quadrupolar field. That is, the axial fields generated by the relatively weak quadrupolar DC could be accompanied, and perhaps overwhelmed by, the concomitant contribution from the RF. Were the strength of quadrupolar DC increased relative to the RF amplitude to the point where the axial forces were comparable, the trappable mass range could be restricted severely.

Another factor to consider is the degree to which ions excited in one radial direction would be dispersed azimuthally because that would influence the strength of the net axial force significantly. Terms above quadrupole in the multipole expansion of the potential as well as collisions with a buffer gas would contribute to azimuthal dispersion.

Another option for providing the counterbalancing axial force would be tapered T-electrodes, which are positioned between the RF rods on the asymptotes of the radial quadrupolar RF field. There would be at least two advantages of this method. One advantage is that the stability of the heaviest ions would not be compromised by quadrupolar DC. Another is that the counterbalancing axial force would increase less strongly with radial amplitude. In fact, in the planes of opposing rods, the axial force due to tapered T-electrodes actually decreases with radial amplitude. Therefore, if an ion's radial motion was restricted primarily to one pole-plane then the counterbalancing axial force could decrease with increasing radial amplitude while the positive axial force increased. However, collisions with buffer gas and terms above quadrupole in the multipole expansion of the potential could result in significant azimuthal dispersion of radially exited ions and the strength of the counterbalancing axial force could vary with the degree of that azimuthal dispersion.

Rod Offset Potential

A third option for the counterbalancing axial force is a DC rod-offset potential between adjacent segments of a multipole rod array. That is, thermalized ions could be confined axially at the exit end of an axial range that was characterized by a break in the DC electrical continuity of the rods. A DC offset potential between the two sections of the quadrupole rod array could provide an axial barrier whose strength varied little with radial position. Consequently, a judiciously chosen offset potential would provide a containment barrier for thermalized (low radial amplitude) ions, while ions with higher radial amplitude, for which the positive axial force was stronger, would be transmitted.

Segmented Auxiliary Electrodes

The fourth option of employing segmented auxiliary electrodes, with adjacent segments coupled resistively, shares the advantages of using tapered T-electrodes as well as the disadvantage of azimuthal non-uniformity. However, segmented auxiliary electrodes have at least three advantages over the tapered T-electrodes. Most importantly, with independent DC supplies connected to opposing ends, auxiliary electrodes, with resistively-coupled segments, provide an axial electric field, whose maximum strength is much greater and whose strength can be varied over a much broader range than the axial field provided by T-electrodes. In addition to increased versatility, segmented T-electrodes have the added advantage of being manufactured cheaply as printed circuit boards.

The Positive Axial Force-Theory

It has been established that the electric potential experienced by a singly-charged ion in a 2D quadrupole field, averaged over one RF cycle, can be given, to a very good approximation at low q, by the expression (see Londry, F. A. and Hager, J. W., "Mass-Selective Axial Ejection from a Linear Quadrupole Ion Trap", J Am Soc Mass Spectrom 2003, 14, 1130-1147, Eq. 20.)

$$\langle\phi_{2D}\rangle_{RF} = \frac{m\Omega^2}{8Q}q^2(X^2+Y^2), \tag{1}$$

where Ω is the angular frequency of the RF drive, X and Y define the radial position of the ion averaged over one RF cycle, m/Q is the mass-to-charge ratio of the ion in units of kilograms/coulomb and q is the Mathieu stability parameter.

Expressing $\langle\phi_{2D}\rangle_{RF}$ in terms of the amplitude of the RF voltage applied to the rods and the radius of the inscribed circle explicitly, Eq. 1 becomes $$\langle\phi_{2D}\rangle_{RF} = \frac{2QV_0^2}{m\Omega^2}\frac{1}{r_0^4}(X^2+Y^2), \tag{2}$$

where $V_0$ is the amplitude of the applied RF voltage and $r_0$ is the radius of the inscribed circle. Now assume that the radius of the inscribed circle increases linearly as a function of z with slope α according to $$r(z) = r_0 + \frac{\partial r}{\partial z}z = r_0 + \alpha z. \tag{3}$$

Then Eq. 2 becomes $$\langle\Phi_{2D}\rangle_{RF} = \frac{2QV_0^2}{m\Omega^2}\frac{1}{(r_0+\alpha z)^4}(X^2+Y^2). \tag{4}$$

Approximating an ion's secular motion as $$X = X_0\cos\frac{2\pi}{T}t, \quad Y = Y_0\cos\frac{2\pi}{T}t, \tag{5}$$

where T is the secular period, we can calculate the expectation value of $\langle\phi_{2D}\rangle_{RF}$ over one secular period according to $$\langle\langle\phi_{2D}\rangle_{RF}\rangle_{sec} = \frac{1}{T}\int_{t=0}^{T}\left(\frac{2QV_0^2}{m\Omega^2}\frac{1}{(r_0+\alpha z)^4}\left(\begin{array}{c}X_0^2\cos^2\left(\frac{2\pi}{T}t\right)+\\ Y_0^2\cos^2\left(\frac{2\pi}{T}t\right)\end{array}\right)\right)dt. \tag{6}$$

Solving Eq. 6 yields $$\langle\langle\phi_{2D}\rangle_{RF}\rangle_{sec} = \frac{QV_0^2}{m\Omega^2}\frac{1}{(r_0+\alpha z)^4}(X_0^2+Y_0^2), \tag{7}$$

where $X_0$ and $Y_0$ are the amplitudes of the ion's secular motion in the x and y directions, respectively. It should be noted though that the accuracy of this approximation diminishes as the Mathieu stability parameter q increases. Specifically, as q increases beyond 0.4, Eq. 7 would overestimate the average potential and the concomitant axial field significantly. Even so, we need to start somewhere.

The axial component of the electric field can be obtained by differentiating the potential of Eq. 7 as $$\langle\langle E_{z,quad}\rangle_{RF}\rangle_{sec} = -\frac{\partial\langle\langle\phi_{2D}\rangle_{RF}\rangle_{sec}}{\partial z} = \frac{4QV_0^2}{m\Omega^2}\frac{\alpha}{(r_0+\alpha z)^5}(X_0^2+Y_0^2). \tag{8}$$

Clearly, the axial field varies with axial position. The axial component of the electric field $\langle\langle E_{z,quad}\rangle_{RF}\rangle_{sec}$ is shown as a function of axial position over an axial range of 10 $r_0$ for α=0.020 in the graph of FIG. 1.

Simulating Divergent $r_0$

It is evident from Eq. 4 that the electric potential field in a divergent rod set monotonically decreases as a function of axial position, z. The effect of a divergent $r_0$ can therefore be simulated by other configurations or arrangements of rod sets in which an equivalent monotonically decreasing field potential is provided.

The expression for field potential in Eq. 2 assumes a constant $r_0$ and a uniform applied RF voltage $V_0$ along the length of the rod set. By rewriting Eq.2 to have an axially dependent RF voltage V(z) and equating the right-hand-sides of Eqs. 2 and 4, we find that $$V(z) = V_0\frac{r_0^2}{(r_0+\alpha z)^2} \tag{9}$$

provides an expression for the axially dependent voltage V(z) that, when applied to a parallel rod set of radius $r_0$, simulates the field potential created for a divergent $r_0$ when a uniform RF voltage $V_0$ is applied. A rod set configuration in which the RF applied voltage has an axial variation according to Eq. 9 can therefore be used to simulate the effect of a divergent $r_0$.

Segmented rods can be used to vary the applied RF amplitude over an axial range by applying an RF signal to one end of the segmented rods, and connecting adjacent segments of the segmented rods with coupling capacitors. By proper selection of the coupling capacitors (and assuming a sufficiently large number of rod segments), an arbitrary axial dependence of the RF amplitude can be approximated, so long as the axial dependence is monotonically decreasing. Thus, a linearly divergent $r_0$ could be simulated experimentally by a segmented axial range of an LIT of constant $r_0$.

Figure 2:
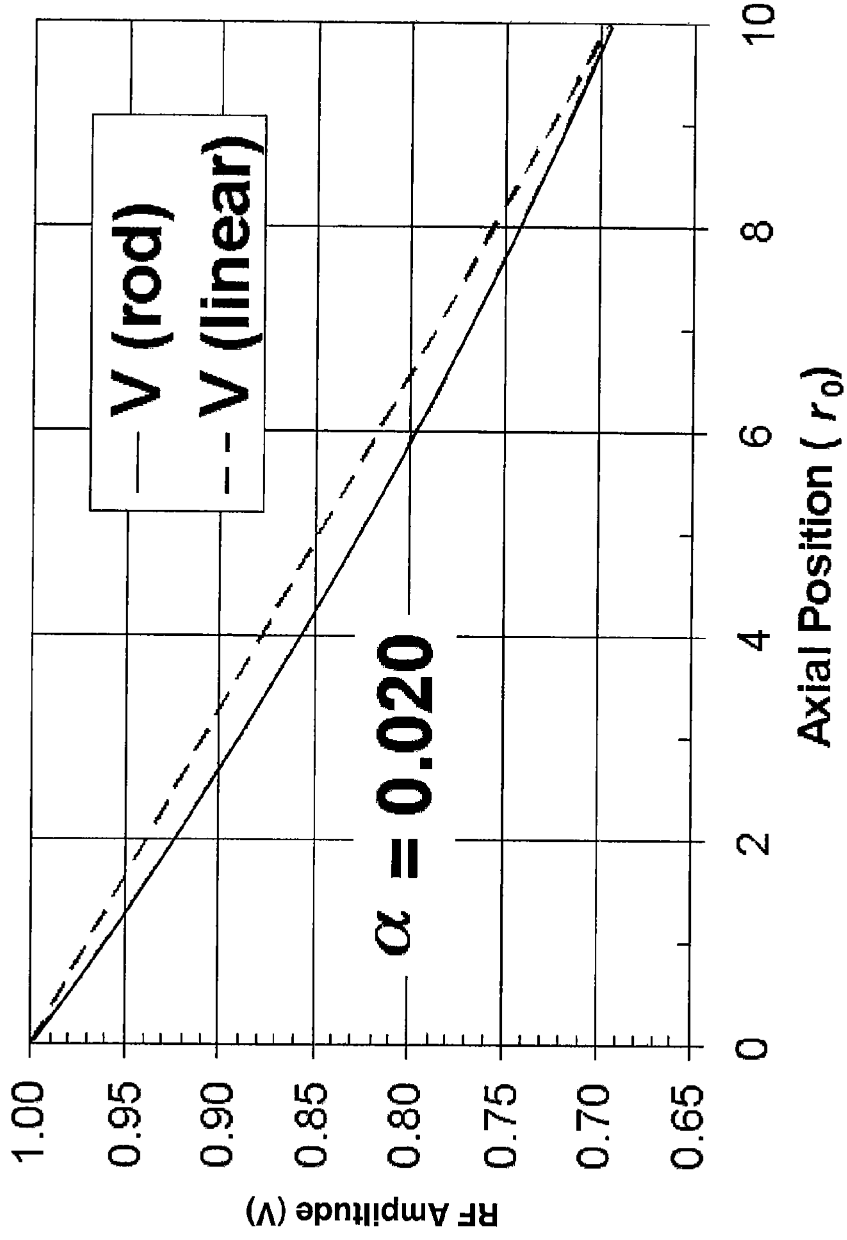
FIG. 2, in a graph, illustrates how to vary the RF amplitude among the segments of a segmented rod set to simulate rods in which a circle inscribed between the rods diverges with a slope of 0.020.

In order to simulate rods for which the inscribed circle increases according to Eq. 3, the RF amplitude applied to discrete segments of the segmented rod set could be varied according to Eq. 9. When α<0.01, Eq. 9 can be approximated well by a straight line. Alternatively, the non-linearity of Eq. 9, which increases with α, can be taken into account. For example, the solid line in FIG. 2 shows how the RF amplitude on parallel rods would have to change as a function of axial position over an axial range of 10 $r_0$ to simulate α=0.020. In FIG. 2, the dashed line simply connects the end-points with a straight line for comparison. It is evident in FIG. 2 that the straight-line approximation may, in certain circumstances, be adequate.

Segmented Array

Figure 3:
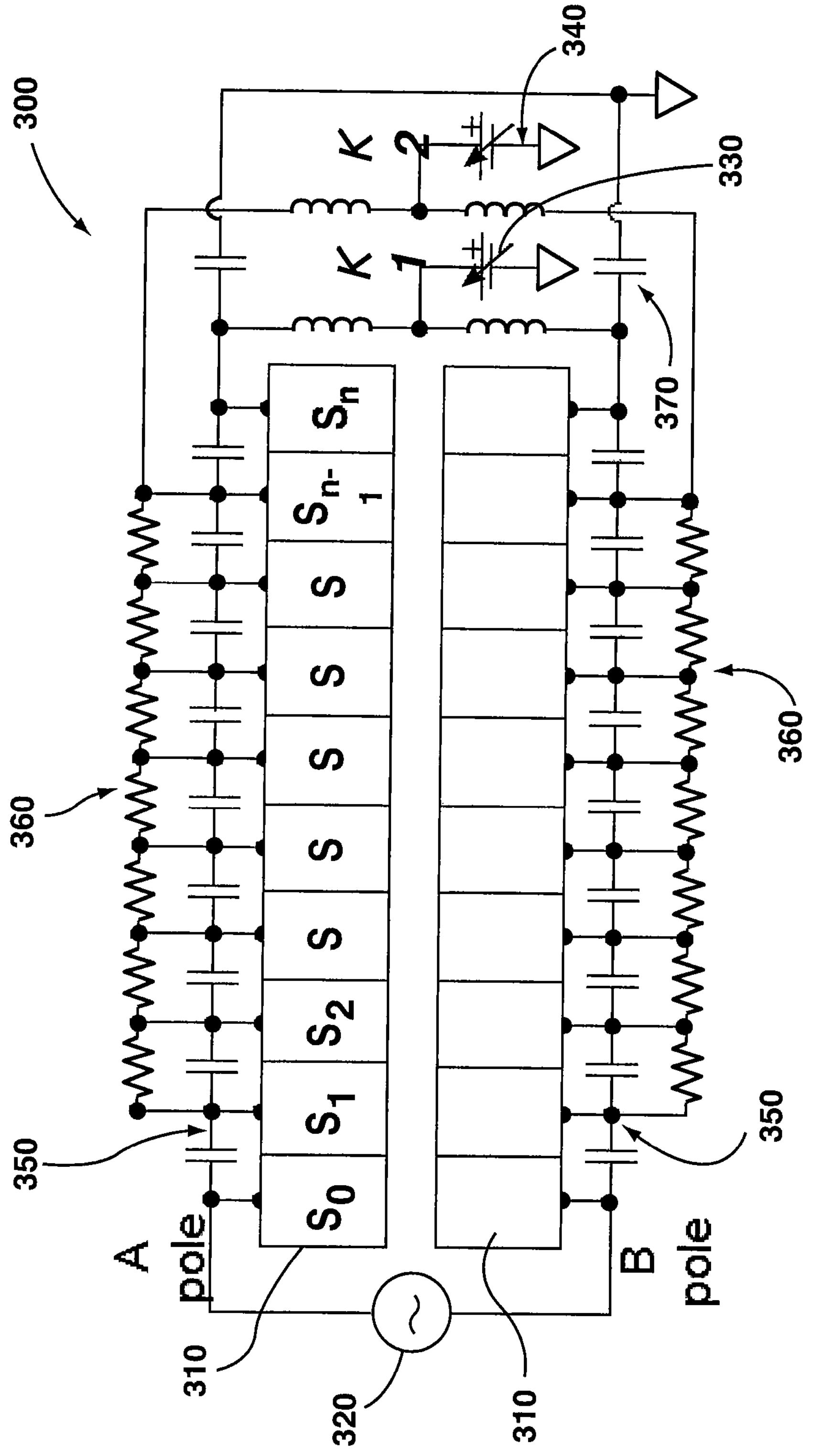
FIG. 3, in a schematic view, illustrates a system comprising a segmented rod set in accordance with an embodiment.

FIG. 3 shows an RC network 300 that can be used to provide a monotonically decreasing RF amplitude to the discrete segments of a segmented rod set 310, starting at the entrance end and moving toward the exit end of the segmented rod set 310. The RC network 300 comprises an RF source 320, two DC offset power supplies 330, 340, coupling capacitors 350, and resistors 360. The RF source 320 is coupled to individual segments of the segmented rod set 310 (denoted $S_0$ to $S_n$ in FIG. 3), by way of coupling capacitors 350 and resistors 360. Each pair of adjacent segments of the rod set 310 from $S_1$ to $S_{n-1}$ is electrically coupled by a corresponding capacitor-resistor parallel combination. Segments $S_0$ and $S_1$ of segmented rod set, as well as segments $S_{n-1}$ and $S_n$, are electrically coupled by a corresponding capacitor only.

The RC network 300 may further comprise terminating capacitors 370 and inductors 380, 390. The terminating capacitors 370 are included in the RC network 300 to make the RF-amplitude characteristics of the segmented rod set 310 less susceptible to stray capacitance. The DC offset power supplies 330, 340 are connected to the A-pole and B-pole of segmented rod set 310 through inductors 380, 390 to prevent shorting the RF voltage 320. It should also be appreciated that DC offset power supply 330 is coupled to segment $S_n$ of segmented rod set 310 only through inductors 380, while DC offset power supply 340 is coupled to segments $S_1$ through $S_{n-1}$ of segmented rod set 310 though inductors 390.

Knowing the physical length of the rod segments and the radius $r_0$, Eq. 9 can be solved for different selected values of α to determine values for the RF voltage applied to individual rod segments $S_0$ to $S_{n-1}$ that will simulate the divergent rod set. In other words, the axial position $z_i$ of segment $S_i$ can be determined from the physical length and number of the segment, and then substituted into Eq. 9 to determine an applied RF voltage $V_i$ for that segment. This process can be repeated for each segment in the segmented rod set 310 to determine a monotonically decreasing RF voltage profile. Complex circuit analysis can then be used to solve values for the coupling capacitors 350 that will provide the required monotonically decreasing RF amplitude over the length of the segmented rod set 310. The rod segments $S_0$ to $S_{n-1}$ can be modeled as equivalent capacitances to ground (the negative terminal of RF voltage 320) in the circuit analysis. The resistors 360 should be chosen to be sufficiently large that they do not affect the applied RF, but sufficiently small that they don't introduce a large time constant or phase shifts. With values for the coupling capacitors 350 designed using Eq. 9, the segmented rod set 310 in RC network 300 simulates a divergent $r_0$.

To confirm use of a segmented rod set to simulate a divergent $r_0$, the RC network 300 of FIG. 3 was solved for an 18-segment rod set (i.e. n=17) taking segments $S_1$ through $S_{16}$ to be 4 mm in length and $r_0$=4.17 mm. In addition, the following conditions were specified. The capacitance to ground of each segments $S_1$ through $S_{n-1}$ is 0.59 pF. The capacitance to ground of segment $S_n$ is 10 pF. The coupling resistors 360 are all 100 kΩ. The terminating capacitors 370 are 12 pF. The inductors 380, 390 are 50 mH with internal resistance 125 Ω.

Figure 4A:
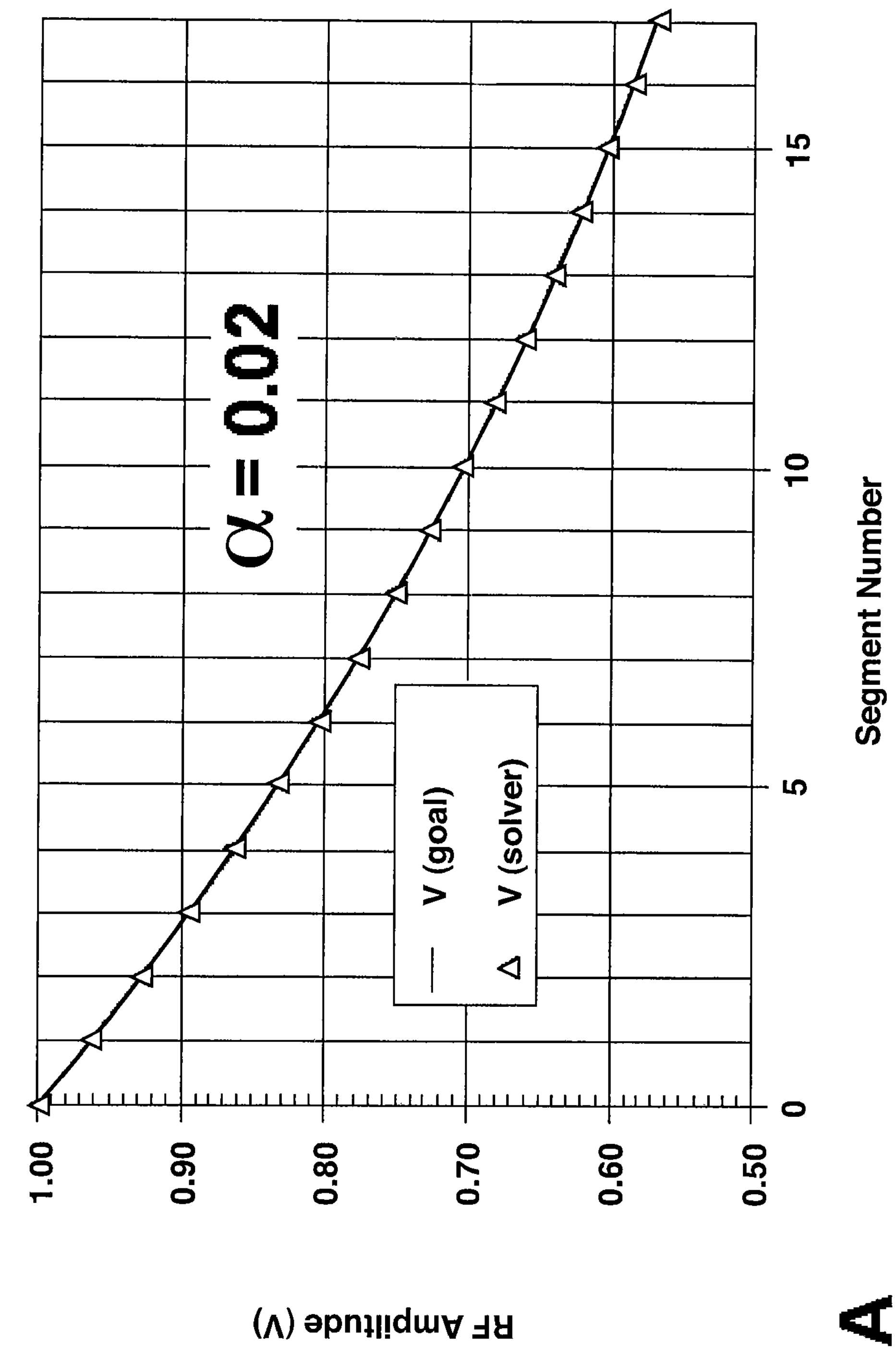
FIG. 4A, in a graph, illustrates that coupling capacitors can be chosen for the circuit of FIG. 5 to simulate a diverging rod set.
Figure 4B:
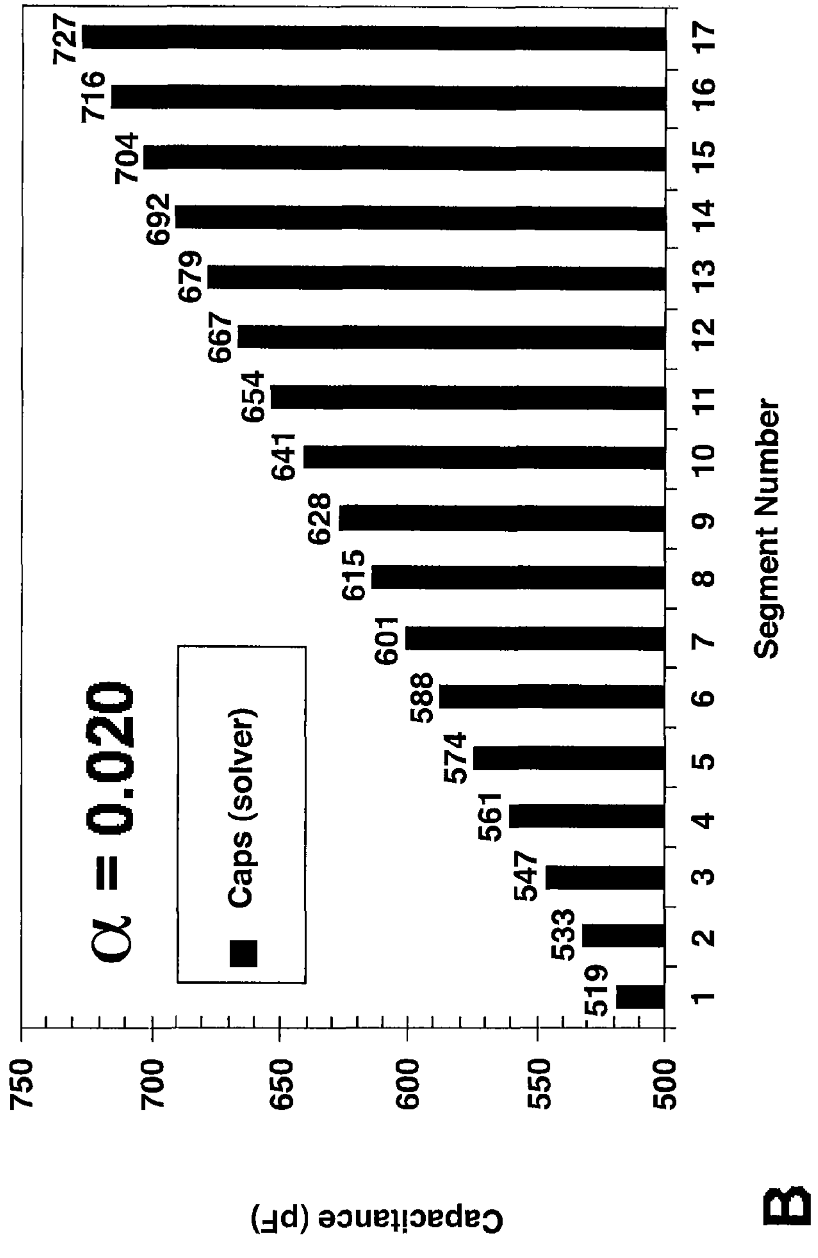
FIG. 4B, in a graph, illustrates the values of the coupling capacitors that could be used to provide the results of FIG. 4A.

Given these simulation parameters, the results are shown in FIGS. 4*a* and 4*b*. The solid line in FIG. 4*a* shows the required RF profile for a divergent rod set with divergence of 2% as given by Eq. 9. The triangles in FIG. 4*a* represent the RF amplitude on each segment when coupling capacitors 360, having the values specified in FIG. 4*b*, were used to connect the segments of the segmented rod set 310. In other words, the capacitance values shown in FIG. 4*b* were determined through complex circuit analysis of the RC network 300 so that the RF voltages applied to the rod segments would track the solid line in FIG. 4*a*, as intended. When the RC network 300 is actually solved using these coupling capacitors 350, the required RF voltages for each segment are observed, as expected. FIGS. 4*a* and 4*b* thus confirm use of a segmented rod set to simulate a divergent $r_0$.

Spiral Implementation

Another way of creating a quadrupolar RF radial field, which diminishes axially, is to turn a portion of a gold-plated ceramic rod into an inductor by using a laser to cut a spiral in the conductive coating. Alternatively, a conductive rod could be wound with suitably insulated wire to achieve the same goal. The RF increase over the inductive portion of the rod could result in an RF quadrupole field that increases (or decreases depending on orientation) with axial position as required.

Figure 5:
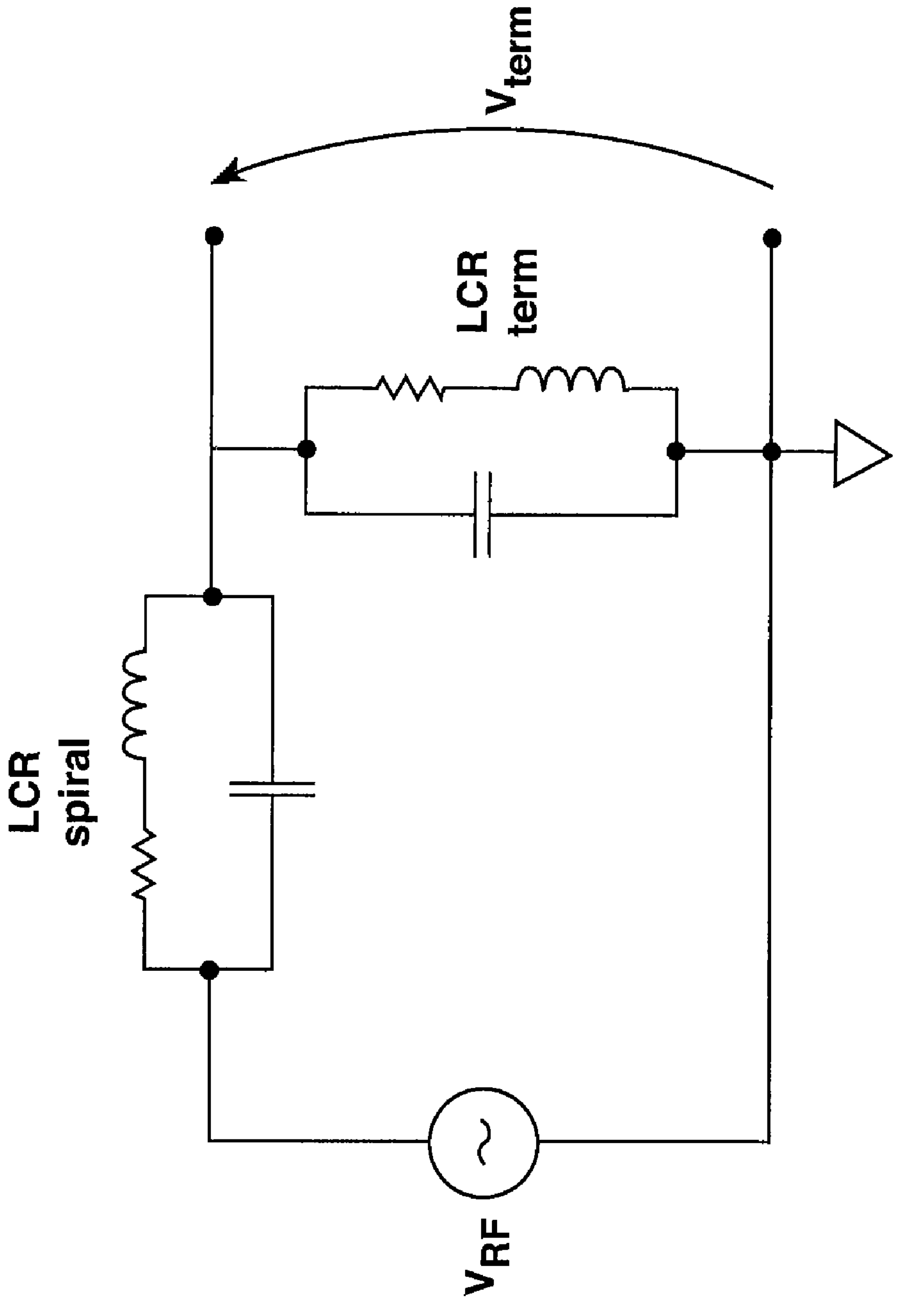
FIG. 5, in a schematic diagram, illustrates an equivalent circuit for a spiral embodiment.

FIG. 5 shows an equivalent circuit for the above-described spiral embodiment. The LCR loads represent the spiral portion of the rod and the terminating components as labelled. Each component is described below RF Amplitudes $V_{RF}$ is the RF drive applied to one end of the spiral.

$V_{term}$ is the RF voltage at the end of the spiral, $V_{term}>V_{RF}$.

Spiral Load $L_{spiral}=K\mu_0 n^2 l\ \pi r^2$ is the inductance of the spiral. represents where $\mu_0$ is the permeability of free space (assume magnetic susceptibility of the ceramic is negligible), n is the number of turns per unit length, l is the length of the spiral, and r is the radius of the rod. The factor K accounts for the finite length of the spiral. (See Paul Lorrain and Dale Corson, "Electromagnetic Fields and Waves, Second Edition," W.H. Freeman and Company, San Francisco, 1970).

$C_{spiral}$ is the capacitance of the spiral portion of the rod.

$R_{spiral}$ is the resistance of the spiral, which depends on the number of turns as $$R_{spiral} = \frac{\rho L}{A} = \frac{\rho n l 2\pi r}{t\left(\frac{l}{n} - w\right)} \tag{16}$$

where ρ is the resistivity of gold, L is the length of the trace, A is the cross-sectional area of the trace, t is the thickness of the gold trace and w is the width of the laser beam that is used to cut the spiral.

Termination Load $L_{term}$ is the inductance of the inductor that is used to isolate the power supply that provides the DC offset voltage to the spiral portion of the rod.

$C_{term}$ is the capacitance of the terminating capacitor between the end of the spiral and ground.

$R_{term}$ is the resistance of the inductor that is used to isolate the power supply that provides the DC offset voltage to the spiral portion of the rod.

The Counterbalancing Negative Axial Force

Regardless of whether the positive axial field is provided by the spiral implementation described immediately above, or by providing a segmented rod set with RF amplitudes diminishing over the length of the rods, or rods that diverge toward the exit end, a negative axial force counterbalancing this positive axial force can still be provided in the rod set to facilitate ion sorting. As described, above, there are various ways of providing this negative axial force, which are described in more detail below.

Quadrupolar DC applied to divergent rods could provide a negative axial force to counterbalance the positive axial force. However, as described above strong azimuthal dependence and restricted mass range are unfavourable side effects of an axial field generated by quadrupolar DC.

Tapered T-Electrodes

Figure 6A:
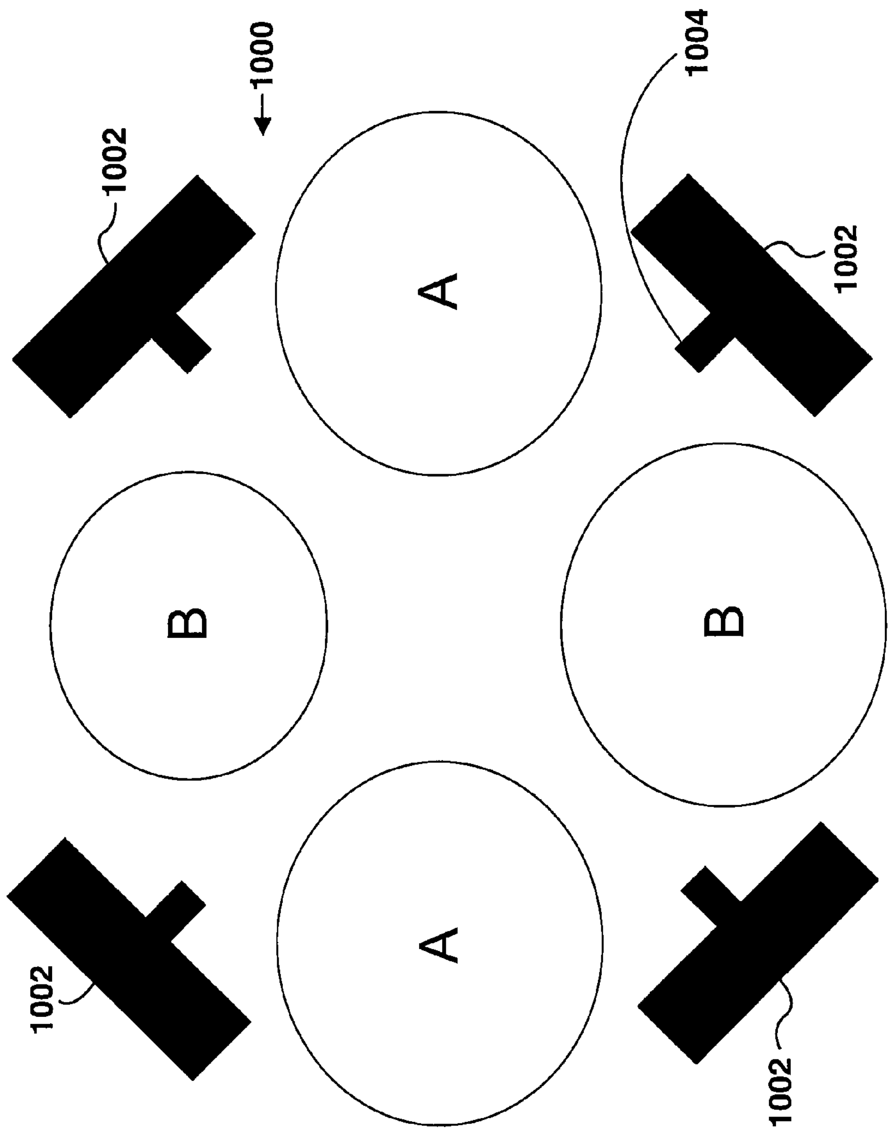
FIG. 6A, in a cross-sectional view, illustrates a quadrupole rod array with tapered T-electrodes in accordance with an embodiment.
Figure 6B:
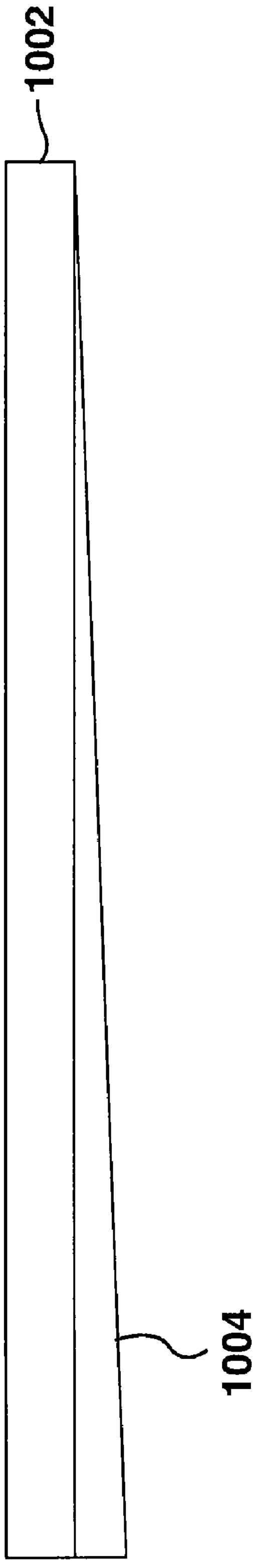
FIG. 6B, in a longitudinal sectional view, illustrates a tapered T-electrode of FIG. 6A.

Tapered T-electrodes in accordance with an embodiment of the invention are illustrated in the sectional views of FIGS. 6A and 6B. Specifically, FIG. 6A, in a cross-sectional view in the x-y plane of a quadrupole rod array 1000, illustrates the tapered T-electrodes 1002 located on the asymptotes of the quadrupole field. FIG. 6B illustrates a tapered T-electrode 1002 of the quadrupole rod array 100 of FIG. 6A. As shown, the tapered T-electrodes are located between adjacent rods of the quadrupole rod array. The quadrupole rod array comprises one pair of opposing rods A and another pair of opposing rods B. As shown in FIG. 6B, each tapered T-electrode comprises a projection 1004 that tapers along the lengths of the rod array 1000.

The strength of the axial electric field provided by the T-electrodes is limited by the slope of the taper and the strength and polarity of the DC potential applied to the T-electrodes. Segmented auxiliary electrodes, positioned similarly to the T-electrodes, could provide a less restrictive alternative. As described previously, with adjacent segments coupled resistively, and independent DC supplies connected to opposing ends, segmented auxiliary electrodes, provide an axial electric field, whose strength can be varied over a much broader range than the axial field provided by T-electrodes, which are powered by similar supplies.

Another variation of the same theme that may work equally well would be to use very short untapered T-electrodes whose projections toward the central axis were relatively large. Although the negative axial force generated by these could be adequate to counterbalance the positive axial force on thermalized ions, this negative axial force would not, on its own, move ions, which were thermalized near the exit end, back toward the entrance.

Rod Offset Potential

Another possibility would be to vary the rod-offset over the rod segments (in the case of a segment rod set), which could provide an axial field of relative uniformity both radially and azimuthally. Such a scheme could be implemented, simply by connecting independent DC supplies to either end of each resistor chain. The downside to this scheme is the heat that would be generated by the drop in DC potential across the resistors.

A variation on the same theme would be to apply a single DC rod-offset potential between two adjacent rod segments. This configuration would provide a single axial barrier of adjustable height rather than the more axially uniform field discussed in the previous paragraph. A judiciously chosen offset potential could provide a containment barrier for thermalized (low radial amplitude) ions, while ions with higher radial amplitude, for which the positive axial force was stronger, would be transmitted.

Some General Points

According to some aspects of some embodiments in the present invention, ions are admitted into a rod set. An RF field provided among the plurality of rods of the rod set is used to radially confine the ions in the rod set. This RF field varies along at least a portion of the length of the rod set to provide, for each of the ions, a corresponding first axial force acting on the ion to push in the ion in a first axial direction (typically, but not necessarily toward the exit end of the rod set). As described above, this variation in the RF field could be provided by having the rods diverge slightly, say at a slope of between 0.1% and 3% away from the longitudinal axis, or, alternatively, at a slope of between 0.15% and 2% away from the longitudinal axis. Alternatively, segmented electrodes or a spiral implementation, as described above, could be used to provide this, or some other, variation in the RF field.

For each of the ions, a corresponding second axial force can be provided to push the ion in a second axial direction opposite to the first axial direction (for example, the second axial direction could be in the direction of the entrance to the rod set). Again as described above, the corresponding first axial force can increase relative to the corresponding second axial force with radial displacement of the ion from the central longitudinal axis in any direction orthogonal to the central longitudinal axis such that the corresponding first axial force is less then the corresponding second axial force when the ion is less than a threshold radial distance from the central longitudinal axis. The corresponding first axial force can exceed the corresponding second axial force when the ion is radially displaced from the central longitudinal axis by more than a threshold radial distance in any direction orthogonal to the central longitudinal axis.

According to a mode of operation in accordance with an aspect of an embodiment of the invention, a first group of ions can be radially excited to increase their associated radial amplitudes relative to the central longitudinal axis such that for each ion in this first group of ions, the corresponding first axial force acting on the ion exceeds the corresponding second axial force acting on the ion to push the first group of ions toward the second end of the rod set. In accordance with some embodiments, this first group of ions can be radially excited by providing an auxiliary RF signal to at least some of the rods for radial resonant excitation as is well known in the art, and then increasing an RF amplitude of the RF field to a first level to bring the first group of ions into resonance with the auxiliary signal to radially excite the first group of ions, as is also well known in the art.

At the same time as this first group of ions is being radially excited, a second group of ions having a different m/z than the first group of ions can be radially confined such that they have associated radial amplitudes smaller than the associated radial amplitudes of the first group of ions such that for each ion in the second group of ions the corresponding second axial force acting on the ion exceeds the first axial force acting on the ion to push the second group of ions toward the first end of the rod set opposite to the second end of the rod set. This first group of ions could be within a first mass range that is disjoint from a second mass range of the second group of ions.

As the corresponding first axial force exceeds the corresponding second axial force for the first group of ions, but not for the second group of ions, the first group of ions can be ejected from the second end of the rod set, while the second group of ions are retained within the rod set.

According to some embodiments of the invention, this first group of ions could be axially ejected to a second mass spectrometer, say, for subsequent mass analysis. In that case, the rod set used to provide the corresponding first and second axial forces could be used to store a very large number of ions and to periodically and rapidly eject selected groups of ions to the downstream mass spectrometer for subsequent mass analysis of these ions. This could reduce space charge problems in the downstream mass spectrometer.

According to some embodiments, the RF amplitude of the RF field could be continuously scanned from a first level, suitable for bringing the first group of ions into resonance with the auxiliary signal to a second level selected to bring the second group of ions into resonance with the auxiliary signal, at which point the second group of ions could be radially excited such that the corresponding first axial force would then exceed the corresponding second axial force for the second group of ions. At the same time, a third group of ions could be radially confined to have associated radial amplitudes smaller than the associated radial amplitudes of the second group of ions, such that for each ion in the third group of ions, the corresponding second axial force acting on the ion exceeds the first axial force acting on the ion to push the third group of ions toward the first end of the rod set opposite to the second end of the rod set. The third group of ions can have a third mass range disjoint from the second mass range of the second group of ions (as well as the first group of ions). Analogous to what was described above in connection with the first group of ions, the second group of ions can then be axially transmitted to a downstream mass spectrometer for subsequent mass analysis or other processing.

The corresponding second axial force can be provided by a second axial field, which could, in turn, be provided by a barrier field provided by, say, a single DC rod-offset potential between two adjacent rod segments, or between a rod segment and a lens. This barrier field could then be operable to contain the ion between the barrier field and the first end of the rod set when the ion is less then the threshold radial distance from the central longitudinal axis (such that the corresponding first axial force is less then the corresponding second axial force for that ion). Conversely, the corresponding first axial force could be operable to push the ion beyond the barrier field when the ion is radially displaced from the central longitudinal axis by more than a threshold radial distance.

In some embodiments, the RF field that varies along a line through the rod set, is a multipolar RF radial field that diminishes axially along the rod set from the first end to the second end. Optionally, this multipolar RF radial field may diminish substantially linearly, or according to any monotonically decreasing functional form, from the first to the second end of the rod set. Optionally, the first end of the rod set may be an entrance end of the rod set, and the second end of the rod set may be an exit end opposite to the entrance end.

In accordance with an aspect of an embodiment of the present invention, a rod set, or a portion of a rod set, with the axial field provided by varying axially the strength of the radial RF field can be combined to advantage with a rod set, or a portion of a rod set, with conventional mass selective axial ejection, as described, for example, in U.S. Pat. No. 6,177,668 (Hager). For example, two rod sets can be operated in tandem. A first or upstream rod set can be configured to provide a radial RF field that varies along the axis of the first rod set to provide an axial field. In contrast, the RF field provided to the second or downstream rod set can be maintained substantially constant along the longitudinal axis of the second or downstream rod set such that the second or downstream rod set does not include the axial field of the first or upstream rod set, but instead relies on conventional mass selective axial ejection to axially eject the ions.

A relatively large number of ions can be stored in the upstream rod set. A particular ion of interest, having a particular selected mass to charge ratio can then be selected from amongst the ions stored in the upstream rod set. Based on this selected mass to charge ratio, a controller can control an RF voltage supply module connected to both the upstream and downstream rod sets. In the case of the upstream rod set, the RF voltage supply module can provide an excitement field, such as a dipolar or quadrupolar excitement field, for example, without limitation, to radially excite ions of the selected mass to charge ratio in the upstream rod set. As the ions of a selected mass to charge ratio increase in radial displacement from the central axis, the axial field can provide a corresponding first axial force acting on the ion to push the ion in a first axial downstream direction toward the exit end of the upstream rod set and the downstream rod set. For these radially displaced ions of the selected mass to charge ratio, this first axial force can exceed a second axial force acting in the opposite or counterbalancing direction, which second axial force can be provided as described above, such that these ions of the selected mass to charge ratio are pushed toward the exit end of the upstream rod set to be axially ejected from the upstream rod set.

In some embodiments, the axial field can be provided in the upstream rod set only at the upstream end thereof by varying axially the strength of the radial RF field only at the upstream end of the upstream rod set. This can be advantageous for at least two reasons. First, it can be preferred to radially displace the ions of the selected mass to charge ratio at some distance from the fringing field at the exit end of the upstream rod set. That is, if ions are radially displaced at or near the fringing field, this can increase the radial dispersion of the ion beam. In other words, for a group of ions of the same mass to charge ratio, the variance of their radial displacement from the central axis can be greater if they are radially excited in the vicinity of the fringing field. This radial dispersion can be undesirable as the excited ions have to be pushed through a small aperture at the downstream end of the rod set. Specifically, this radial dispersion can reduce efficiency as it can reduce the probability of ions passing through the small aperture at the downstream or exit end of the upstream rod set.

In addition to this reason, if the strength of the RF radial field is varied at or near the fringing fields, and the ions are also radially excited in the vicinity of the fringing field, then an increased variance in radial dispersion can lead to an increased variance in axial energy imparted to the selected group of ions that has been radially excited, such that the range of axial energies imparted to those ions will have a higher variance than if they have been radially excited at the upstream end of the upstream rod set, away from the fringing fields. This can result in some of the ions of the selected mass to charge ratio being ejected to the downstream rod set with so much axial energy that they are shot through both the downstream rod set and an exit barrier of the downstream rod set in an uncontrolled way.

The above-described controller can also be used to control the RF voltage supply module to configure the second or downstream rod set in tandem with the first or upstream rod set such that the second rod set can be configured to axially eject the ions of the selected mass to charge ratio.

This combination of the two rod sets operating in tandem can be used to try and address both efficiency and resolution problems in mass spectrometers. Specifically, as mentioned above, a rod set provided with an axial field by axially varying the strength of the radial RF field provided to the rod set can be used to store ions at a relatively high space charge density. Further, such an axial field can be used to axially eject selected ions from this upstream rod set at relatively high efficiencies—say, for example, at an efficiency of 80%. This may compare very favorably with the lower efficiencies of axial ejection from rod sets with high space charge density that may be achieved by conventional mass selective axial ejection. Unfortunately, this higher efficiency can come at the cost of lower resolution.

Accordingly, the downstream rod set can be used to receive the ions of the selected mass to charge ratio axially ejected from the upstream rod set at relatively high efficiencies and low resolution. As space charge density in the downstream rod set can be kept relatively low, by reason that the downstream rod set can, for the most part, contain only ions of the selected mass to charge ratio, the ions of the selected mass to charge ratio can be axially ejected from the downstream rod set at relatively high resolution. In general, resolution deteriorates for greater space charge densities.

It can be advantageous to operate the upstream rod set at a much higher pressure than the downstream rod set, as the upstream rod set may be used to store much higher ion population densities. However, this may not be necessary. For example, according to some embodiments of the present invention, the upstream and downstream rod set described immediately above can be replaced with a single rod set. In fact, such a single rod set can be a segmented rod set as shown, for example, in FIG. 3.

As noted above, and shown in FIG. 3, end segments $S_0$ and $S_n$ can be capacitively coupled, but not resistively coupled to the intermediate segments. Further, segments $S_0$ and $S_n$ could be of any suitable length. Thus, in the case of a rod set configured to vary the radial RF field and provide a resulting axial field at its upstream end, with relatively conventional operation at its downstream end, segment $S_n$ could be elongated. In this embodiment, the radial RF field could be substantially invariant along segment $S_n$, such that the axially dependent radial field and the resulting axial force would not be provided in $S_n$. Alternatively, additional segments, say $S_{n+1}$, could be provided. In such an embodiment, $S_{n-1}$ would represent an intermediate portion of the rod set between an upstream portion, comprising segments $S_0$ to $S_{n-1}$, and a downstream portion of the rod set comprising segment $S_{n+1}$.

According to these embodiments of the invention, the upstream portion of the rod set, in which the radial RF field is varied to provide the axial field, could be operated in a manner analogous to the upstream rod set described immediately above, while the downstream portion of the single rod set, comprising segment $S_{n+1}$, could be operated in the relatively conventional manner according to the second or downstream rod set described above. Of course, in both of these embodiments, the counterbalancing force acting against the axial force provided by the axial field provided by the variation in radial RF field could be provided only at the upstream rod set, or the upstream end of the single rod set.

Similar to the embodiment described above, the bulk of the ion population could, preferably, be kept in the upstream portion of the rod set, comprising segments $S_1$ to $S_{n-1}$. Both the upstream and downstream ends of the rod set could be operated in tandem, such that only ions of a selected mass to charge ratio are, first, radially displaced by an excitement field within the upstream end of the rod set such that the axial field created by the variation in radial RF field pushes these ions down towards segments $S_n$ and $S_{n+1}$, overcoming a secondary or counterbalancing axial force and possibly penetrating a possible barrier field provided at segment $S_n$, to be pushed into the portion of the rod set comprising segment $S_{n+1}$. In the downstream end of the rod set comprising segment $S_{n+1}$, the ions of selected mass to charge ratio could be, say, axially ejected by conventional mass selective axial ejection at relatively high resolutions. As described above, the radial RF field along segment $S_{n+1}$ could be kept substantially constant, as the segment $S_{n+1}$ is used for axial ejection.

Section headings used herein are for organizational purposes only and are not to be construed as limiting the subject matter described in any manner.

While the applicant's teachings are described in conjunction with various embodiments and aspects, it is not intended that the applicant's teachings be limited to such embodiments or aspects. On the contrary, the applicants teachings encompass various alternatives, modifications and equivalents, as will be appreciated by those skilled in the art. It is therefore to be understood that within the scope of the appended claims, the invention may be practiced otherwise than as specifically described herein.

The invention claimed is:

1. A method of operating a mass spectrometer system having an elongated rod set, the rod set having a first end, a second end, a plurality of rods and a central longitudinal axis, the method comprising:

a) admitting ions into the rod set;

b) producing an RF field between the plurality of rods to radially confine the ions in the rod set, wherein the RF field varies along at least a portion of a length of the rod set to provide, for each of the ions, a corresponding first axial force acting on the ion to push the ion in a first axial direction; and, c) for each of the ions, providing a corresponding second axial force to push the ion in a second axial direction opposite to the first axial direction; wherein the corresponding first axial force increases relative to the corresponding second axial force with radial displacement of the ion from the central longitudinal axis in any direction orthogonal to the central longitudinal axis such that the first corresponding axial force is less than the corresponding second axial force when the ion is less than a threshold radial distance from the central longitudinal axis and the corresponding first axial force exceeds the corresponding second axial force when the ion is radially displaced from the central longitudinal axis by more than the threshold radial distance in any direction orthogonal to the central longitudinal axis.

2. The method as defined in claim 1 further comprising d) radially exciting a first group of the ions to increase associated radial amplitudes of the first group of the ions from the central longitudinal axis such that for each ion in the first group of ions, the corresponding first axial force acting on the ion exceeds the corresponding second axial force acting on the ion to push the first group of the ions toward the second end of the rod set; and, e) radially confining a second group of the ions to have associated radial amplitudes smaller than the associated radial amplitudes of the first group of ions such that for each ion in the second group of ions, the corresponding second axial force acting on the ion exceeds the first axial force acting on the ion to push the second group of the ions toward the first end of the rod set opposite to the second end of the rod set;

wherein the first group of the ions is within a first mass range, and the second group of the ions is within a second mass range disjoint from the first mass range.

3. The method as defined in claim 2 wherein d) further comprises ejecting the first group of ions from the second end of the rod set; and, e) further comprises retaining the second group of ions in the rod set during d).

4. The method as defined in claim 2 wherein d) comprises i) providing an auxiliary signal for radial resonant excitation, and ii) increasing an RF amplitude of the RF field to a first level to bring the first group of ions into resonance with the auxiliary signal to radially excite the first group of the ions.

5. The method as defined in claim 3 further comprising, after d) and e), f) radially exciting the second group of the ions to increase the associated radial amplitudes of the second group of the ions from the central longitudinal axis such that for each ion in the second group of ions, the corresponding first axial force acting on the ion exceeds the corresponding second axial force acting on the ion to push the second group of the ions toward the second end of the rod set; and, g) radially confining a third group of the ions to have associated radial amplitudes smaller than the associated radial amplitudes of the second group of ions such that for each ion in the third group of ions, the corresponding second axial force acting on the ion exceeds the first axial force acting on the ion to push the third group of the ions toward the first end of the rod set opposite to the second end of the rod set;

wherein the third group of the ions is within a third mass range disjoint from the second mass range.

6. The method as defined in claim 5 wherein f) further comprises ejecting the second group of ions from the second end of the rod set; and, g) further comprises retaining the third group of ions in the rod set during f).

7. The method as defined in claim 6 wherein d) comprises i) providing an auxiliary signal for radial resonant excitation and ii) increasing an RF amplitude of the RF field to a first level to bring the first group of ions into resonance with the auxiliary signal to radially displace the first group of the ions; and, f) comprises increasing the RF amplitude of the RF field to a second level to bring the second group of ions into resonance with the auxiliary signal to radially excite the second group of the ions.

8. The method as defined in claim 1 wherein the RF amplitude of the RF field is continuously scanned from the first level to the second level.

9. The method as defined in claim 1 wherein c) comprises providing a second axial field for providing, for each of the ions, the corresponding second axial force.

10. The method as defined in claim 9 wherein the second axial field is a barrier field provided between the first end and the second end of the rod set;

for each of the ions, i) the barrier field is operable to contain the ion between the barrier field and the first end of the rod set when the ion is less than the threshold radial distance from the central longitudinal axis, and ii) the corresponding first axial force is operable to push the ion beyond the barrier field when the ion is radially displaced from the central longitudinal axis by more than the threshold radial distance.

11. The method as defined in claim 1 wherein the RF field is a multipolar RF radial field; and the multipolar RF radial field diminishes along the rod set from the first end to the second end.

12. The method as defined in claim 11 wherein the multipolar RF radial field diminishes substantially linearly from the first end to the second end.

13. The method as defined in claim 3 further comprising operating a second rod set in tandem with the rod set, the second rod set being positioned to receive the first group of ions axially ejected from the second end of the rod set at a first resolution; and, wherein the second rod set is configured to axially eject the first group of ions at a second resolution higher than the first resolution.

14. The method as defined in claim 13 wherein the rod set has an upstream ion density and the second rod set has a downstream ion density, and the method further comprises maintaining the downstream ion density lower than the upstream ion density to maintain the second resolution higher than the first resolution.

15. A mass spectrometer system comprising:

an ion source;

a rod set, the rod set having a plurality of rods extending along a longitudinal axis, a first end for admitting ions from the ion source, and a second end for ejecting ions traversing the longitudinal axis of the rod set; and, an RF voltage supply module for i) providing an RF voltage to the rod set to produce an RF field between the plurality of rods of the rod set to radially confine the ions in the rod set, wherein the rod set is configured such that the RF field varies along at least a portion of the rod set to provide, for each of the ions, a corresponding first axial force acting on the ion to push the ion in a first axial direction; and, a secondary voltage supply module for i) providing a secondary voltage to the rod set to provide, for each of the ions, along at least the portion of the rod set, a corresponding second axial force to push the ion in a second axial direction opposite to the first axial direction; wherein the corresponding first axial force increases relative to the corresponding second axial force with radial displacement of the ion from the central longitudinal axis in any direction orthogonal to the central longitudinal axis such that the first corresponding axial force is less than the corresponding second axial force when the ion is less than a threshold radial distance from the central longitudinal axis and the corresponding first axial force exceeds the corresponding second axial force when the ion is radially displaced from the central longitudinal axis by more than the threshold radial distance in any direction orthogonal to the central longitudinal axis.

16. The mass spectrometer system as defined in claim 15 wherein the plurality of rods diverge from the longitudinal axis in the first axial direction from the first end to the second end.

17. The mass spectrometer system as defined in claim 16 wherein the plurality of rods have a slope of between 0.1% and 3% away from the longitudinal axis.

18. The mass spectrometer system as defined in claim 16 wherein the plurality of rods have a slope of between 0.15% and 2% away from the longitudinal axis.

19. The mass spectrometer system as defined in claim 16 wherein the plurality of rods diverge substantially linearly from the longitudinal axis.

20. The mass spectrometer system as defined in claim 15 wherein each rod in the plurality of rods comprises a plurality of segments, and an RF amplitude of the RF voltage supplied to each rod varies between adjacent segments of each rod.

21. The mass spectrometer system as defined in claim 20 wherein each pair of the adjacent segments of each rod are electrically coupled by a capacitor and a resistor, the capacitor and resistor being jointly operable to reduce the RF amplitude from an adjacent segment closer to the first end to an adjacent segment closer to the second end.

22. The mass spectrometer system as defined in claim 21 wherein a capacitance of the capacitor and a resistance of the resistor are selected for each pair of the adjacent segments of each rod such that the RF amplitude is reduced by substantially equal amounts from segment to segment along the length of the rod set.

23. The mass spectrometer system as defined in claim 20 wherein the secondary voltage supply module is connected to the rod set to provide DC offset potential between at least one pair of adjacent segments of the rod set;

the second axial field is a barrier field provided by the DC offset potential; and for each of the ions, i) the barrier field is operable to contain the ion between the barrier field and the first end of the rod set when the ion is less than the threshold radial distance from the central longitudinal axis, and ii) the corresponding first axial force is operable to push the ion beyond the barrier field when the ion is radially displaced from the central longitudinal axis by more than the threshold radial distance.

24. The mass spectrometer system as defined in claim 20 wherein the plurality of segments comprises a first end segment at one end of the rod and a second end segment at a second end of the rod opposite to the first end of the rod; and, the secondary voltage supply module comprises a first DC supply for supplying a first DC voltage to the first end segment, and a second DC supply for supplying a second DC voltage to the second end segment, wherein the first DC voltage differs from the second DC voltage to provide the corresponding second axial force.

25. The mass spectrometer system as defined in claim 15 wherein the plurality of rods receive the RF voltage from the RF voltage supply module to produce the RF field;

the rod set further comprises a plurality of auxiliary electrodes for providing a secondary axial field to provide, for each of the ions, the secondary axial force, the secondary voltage supply module being electrically coupled to the plurality of auxiliary electrodes to provide the secondary axial field.

26. The mass spectrometer system as defined in claim 25 wherein each rod in the plurality of rods comprises an exterior conductive surface, and an inductor located along a spiral path on the exterior conductive surface, wherein the spiral inductor is operable to provide an inductive effect along the spiral path to vary the RF field.

27. The mass spectrometer system as defined in claim 26 wherein for each rod in the plurality of rods, the inductor comprises a groove cut into the exterior conductive surface along the spiral path.

28. The mass spectrometer system as defined in claim 26 wherein for each rod in the plurality of rods, the inductor comprises an insulator located along the spiral path on the exterior conductive surface.

29. The mass spectrometer system as defined in claim 15 further comprising:

a second rod set positioned to receive ions axially ejected from the second end of the rod set, the RF voltage supply module being connected to the second rod set to produce an RF field within the second rod set to radially confine the ions in the second rod set;

a controller for controlling the RF voltage supply module based on a selected mass to charge ratio to concurrently i) provide a radial excitement field to the rod set to radially excite ions of the selected mass to charge ratio such that the first axial force acting on the ions of the selected mass to charge ratio exceeds the second axial force to push the ions of the selected mass to charge ratio through the rod set and axially eject the ions of the selected mass to charge ratio from the second end of the rod set, and ii) configure the second rod set in tandem with the rod set such that the second rod set is configured to axially eject the ions of the selected mass to charge ratio.

30. The mass spectrometer system as defined in claim 15 wherein the rod set comprises an upstream portion including the portion of the rod set along which the RF field varies to provide, for each of the ions, the corresponding first axial force acting on the ion to push the ion in the first axial direction, and a downstream portion configured to provide a substantially constant RF field along the longitudinal axis.

* * * * *